United States Patent
Wang et al.

(10) Patent No.: US 12,424,458 B2
(45) Date of Patent: Sep. 23, 2025

(54) MANUFACTURING METHOD OF PACKAGE STRUCTURE OF ELECTRONIC DEVICE

(71) Applicant: Innolux Corporation, Miao-Li County (TW)

(72) Inventors: Cheng-Chi Wang, Miao-Li County (TW); Chien-Feng Li, Miao-Li County (TW); Kuang-Ming Fan, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 516 days.

(21) Appl. No.: 17/751,643

(22) Filed: May 23, 2022

(65) Prior Publication Data

US 2023/0238252 A1     Jul. 27, 2023

(30) Foreign Application Priority Data

Jan. 24, 2022   (CN) .......................... 202210082626.6

(51) Int. Cl.
*H01L 21/56*     (2006.01)
*H01L 23/00*     (2006.01)
(Continued)

(52) U.S. Cl.
CPC ............ *H01L 21/568* (2013.01); *H01L 24/19* (2013.01); *H01L 23/293* (2013.01);
(Continued)

(58) Field of Classification Search
CPC ......... H01L 2221/68359; H01L 21/568; H01L 2221/68304; H01L 2221/68318; H01L 2924/3511
See application file for complete search history.

(56) References Cited

U.S. PATENT DOCUMENTS 9,761,566 B1 *  9/2017  Yu ........................ H01L 25/105
9,899,337 B2 *  2/2018  Chang ................... H01L 24/19
(Continued)

FOREIGN PATENT DOCUMENTS

CN    107134414    9/2017
CN    108701657    10/2018
(Continued)

OTHER PUBLICATIONS

"Office Action of Taiwan Counterpart Application", issued on Oct. 31, 2022, p. 1-p. 4.
(Continued)

*Primary Examiner* — David A Zarneke
(74) *Attorney, Agent, or Firm* — JCIPRNET

(57) ABSTRACT

A manufacturing method of a package structure of an electronic device is provided. The manufacturing method includes the following. First, a carrier plate is provided. The carrier plate includes a composite structure and has a first surface and a second surface opposite to each other. Next, an anti-warpage structure is formed on the first surface of the carrier plate. Then, a redistribution structure is formed on the second surface of the carrier plate. When the package structure manufactured with the manufacturing method of the package structure of the electronic device of the disclosure is applied to the electronic device, reliability and/or electrical properties of the electronic device are enhanced.

10 Claims, 7 Drawing Sheets

(51) Int. Cl.
*H01L 23/29* (2006.01)
*H01L 23/31* (2006.01)

(52) U.S. Cl.
CPC .............. *H01L 23/3107* (2013.01); *H01L 2221/68304* (2013.01); *H01L 2221/68318* (2013.01); *H01L 2924/3511* (2013.01)

(56) References Cited

U.S. PATENT DOCUMENTS

| | | | | |
|---|---|---|---|---|
| 9,947,554 | B2* | 4/2018 | Choi | H01L 21/568 |
| 10,886,146 | B2* | 1/2021 | Matsuura | C23C 14/35 |
| 11,304,290 | B2* | 4/2022 | Yu | H01L 23/49816 |
| 11,626,337 | B2* | 4/2023 | Lee | H01L 24/20 |
| | | | | 257/773 |
| 11,791,283 | B2* | 10/2023 | Hayes | H01L 21/561 |
| | | | | 438/124 |
| 11,929,293 | B2* | 3/2024 | Lin | H01L 23/053 |
| 2018/0025955 | A1* | 1/2018 | Rusli | H01L 23/5226 |
| | | | | 438/108 |
| 2020/0152484 | A1* | 5/2020 | Kwon | H01L 25/105 |
| 2021/0343569 | A1* | 11/2021 | Kim | H01L 21/568 |
| 2021/0407904 | A1* | 12/2021 | Liang | H01L 21/76805 |
| 2022/0246532 | A1* | 8/2022 | Sandstrom | H01L 24/97 |
| 2023/0052065 | A1* | 2/2023 | Chen | H01L 24/48 |

FOREIGN PATENT DOCUMENTS

| | | |
|---|---|---|
| CN | 110447097 | 11/2019 |
| TW | 201917861 | 5/2019 |
| TW | 201919190 | 5/2019 |
| TW | 202133282 | 9/2021 |

OTHER PUBLICATIONS

"Office Action of Taiwan Counterpart Application", issued on Jun. 30, 2025, p. 1-p. 5.

* cited by examiner

MANUFACTURING METHOD OF PACKAGE STRUCTURE OF ELECTRONIC DEVICE

CROSS-REFERENCE TO RELATED APPLICATION

This application claims the priority benefit of China application serial no. 202210082626.6, filed on Jan. 24, 2022. The entirety of the above-mentioned patent application is hereby incorporated by reference herein and made a part of this specification.

BACKGROUND

Technical Field

The disclosure relates to a manufacturing method of a package structure, and in particular, to a manufacturing method of a package structure of an electronic device.

Description of Related Art

In a manufacturing process of an electronic device, different materials used to form a package structure of the electronic device have different physical properties (e.g. the coefficient of thermal expansion). Hence, warpage is likely to occur in a manufactured package structure. When the package structure is applied to the electronic device, it may lead to a short circuit and/or abnormal signal transmission of a circuit structure in the electronic device, thereby reducing the reliability and/or the electrical properties of the manufactured electronic device.

SUMMARY

The disclosure is directed to a manufacturing method of a package structure of an electronic device. When the package structure manufactured with the manufacturing method is applied to the electronic device, reliability and/or electrical properties of the electronic device are enhanced.

According to a manufacturing method of a package structure provided in some embodiments of the disclosure, the manufacturing method includes the following. First, a carrier plate is provided. The carrier plate includes a composite structure and has a first surface and a second surface opposite to each other. Next, an anti-warpage structure is formed on the first surface of the carrier plate. Then, a redistribution structure is formed on the second surface of the carrier plate.

According to a manufacturing method of a package structure provided in other embodiments of the disclosure, the manufacturing method includes the following. First, a carrier plate is provided. Next, an encapsulation structure is formed on the carrier plate. The encapsulation structure includes a semiconductor chip and an encapsulation layer and has a third surface and a fourth surface opposite to each other. A pad is disposed on a surface of the semiconductor chip close to the carrier plate, and the encapsulation layer exposes the semiconductor chip. The third surface of the encapsulation structure faces the carrier plate. Next, an anti-warpage structure is formed on the fourth surface of the encapsulation structure. Then, the carrier plate is removed. Then, a redistribution structure is formed on the third surface of the encapsulation structure.

In order to make the aforementioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
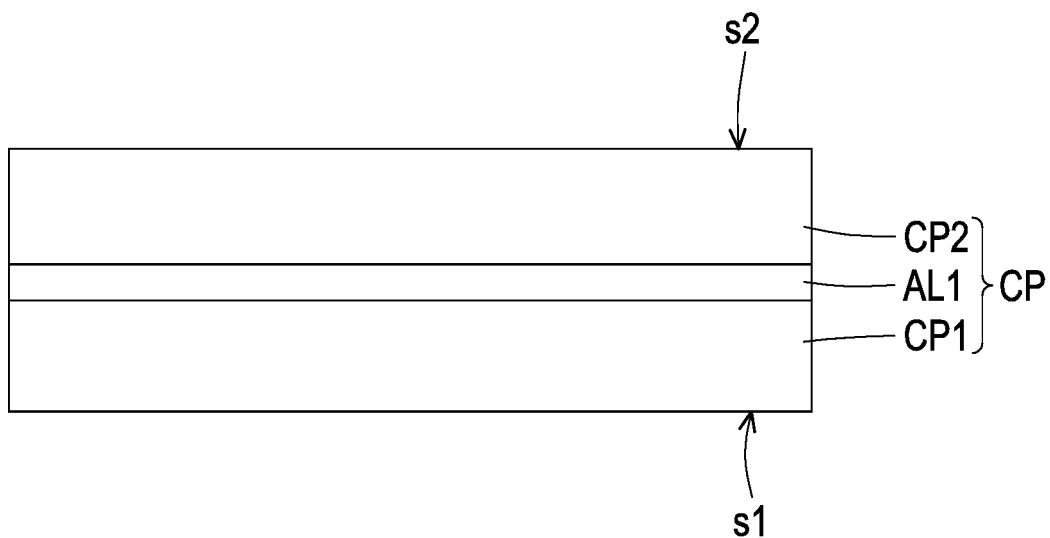
FIG. 1A to FIG. 1C are schematic partial cross-sectional diagrams of a manufacturing method of a package structure of an electronic device according to a first embodiment of the disclosure.

The disclosure may be understood by referring to the following detailed description and the accompanying drawings. It should be duly noted that, for the ease of readers' comprehension and the simplicity of the drawings, the drawings of this disclosure only illustrate parts of the electronic device, and the specific elements in the drawings may not be drawn to the actual scale ratio. Also, the number and size of each element in the drawings are only for schematic use, and do not limit the scope of the disclosure.

Throughout the description and the appended claims, certain terms are used to refer to specific elements. Those skilled in the art should understand that electronic apparatus manufacturers may refer to the same component by different terms. The present specification does not intend to distinguish between components that differ in name but not function. In the following specification and claims, words such as "including", "comprising", and "having" are open-ended words, so they should be interpreted as meaning "containing but not limited to . . . ". Therefore, when terms "include", "comprise", and/or "have" are used in the description of the present disclosure, the presence of corresponding features, regions, steps, operations and/or components is specified without excluding the presence of one or more other features, regions, steps, operations and/or components.

The directional terms mentioned in this text, such as "upper," "lower," "front," "rear," "left," "right," merely refer to directions in the drawings. Therefore, the directional terms used are used for purposes of illustration and not to limit the present disclosure. In the accompanying drawings, common features of a method, a structure and/or a material used in a specific embodiment are shown in the drawings. However, these drawings should not be construed as defining or limiting the scope or nature of these embodiments. For example, the relative size, thickness, and location of each film layer, region, and/or structure may be reduced or enlarged for clarity.

When a corresponding component (such as a film layer or a region) is referred to as being "on another component", the component may be directly on the other component or there may be another component between the two. On the other hand, when a component is referred to as being "directly on another component", there is no component between the two. Also, when a component is referred to as being "on another component", the two have a top-down relationship in the top view direction, and the component may be above or below the other component, and the top-down relationship depends on the orientation of the device.

The terms "approximately", "equal to", "equal" or "same", "substantially" or "roughly" are generally interpreted as being within 20% of a given value or range, or interpreted as being within 10%, 5%, 3%, 2%, 1%, or 0.5% of a given value or range.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The claims and the specification may not use the same terms, and accordingly, the first component in the specification may be the second component in the claims.

It should be noted that the embodiments listed below can replace, recombine, and mix features in several different embodiments to achieve other embodiments without departing from the principle of the disclosure. The features of the embodiments may be arbitrarily mixed and combined as long as they do not depart from or conflict with the spirit of the disclosure.

The terms "electrically connect" and "couple" described in the disclosure include any direct and indirect electrical connection. In a case of direct electrical connection, end points of two circuits are directly connected or connected to each other with a conductive line. In a case of indirect electrical connection, there is a switch, a diode, a capacitor, inductance, a resistor, or other suitable component, or a combination of the components above between the end points of the two circuits; however, the disclosure is not limited thereto.

In the disclosure, the thickness, the length, and the width may be measured by an optical microscope, and the thickness and the width may be measured based on a cross-sectional image in an electron microscope, but the disclosure is not limited thereto. In addition, there may be a certain error between any two values or directions used for comparison. When a first value is equal to a second value, it implies that there may be an error of about 10% between the first value and the second value. When a first direction is perpendicular to a second direction, an angle between the first direction and the second direction ranges from 80 degrees to 100 degrees. When the first direction is parallel to the second direction, the angle between the first direction and the second direction ranges from 0 degrees to 10 degrees.

The electronic device may have a composite layer circuit structure of the embodiment of the disclosure. The electronic device of the disclosure may include display, antenna (such as liquid crystal antenna), lighting, sensing, touch, splicing, other suitable functions, or a combination of the above functions, but not limited thereto. The electronic device includes a rollable or flexible electronic device, but not limited thereto. The display device may include, for example, liquid crystal, a light emitting diode (LED), a quantum dot (QD), fluorescence, phosphor, other suitable materials, or a combination thereof. The light emitting diode may include, for example, an organic light emitting diode (OLED), a mini light emitting diode (mini LED), a micro light emitting diode (micro LED), or a quantum dot light emitting diode (quantum dot LED), but is not limited thereto. The electronic device may include a transistor, a circuit board, a chip, a die, an integrated circuits (IC), or a combination of the above devices, or other suitable electronic devices, but is not limited thereto.

Reference will now be made in detail to the present exemplary embodiments of the disclosure. The same reference numerals are used in the drawings and the description to refer to the same or like parts.

Figure 1B:
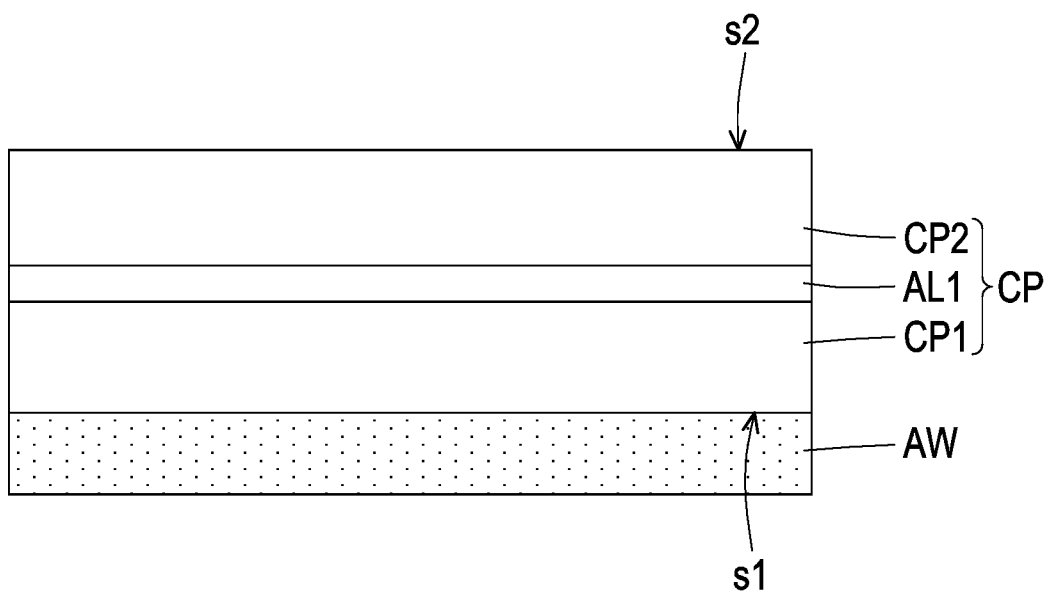
Figure 1C:
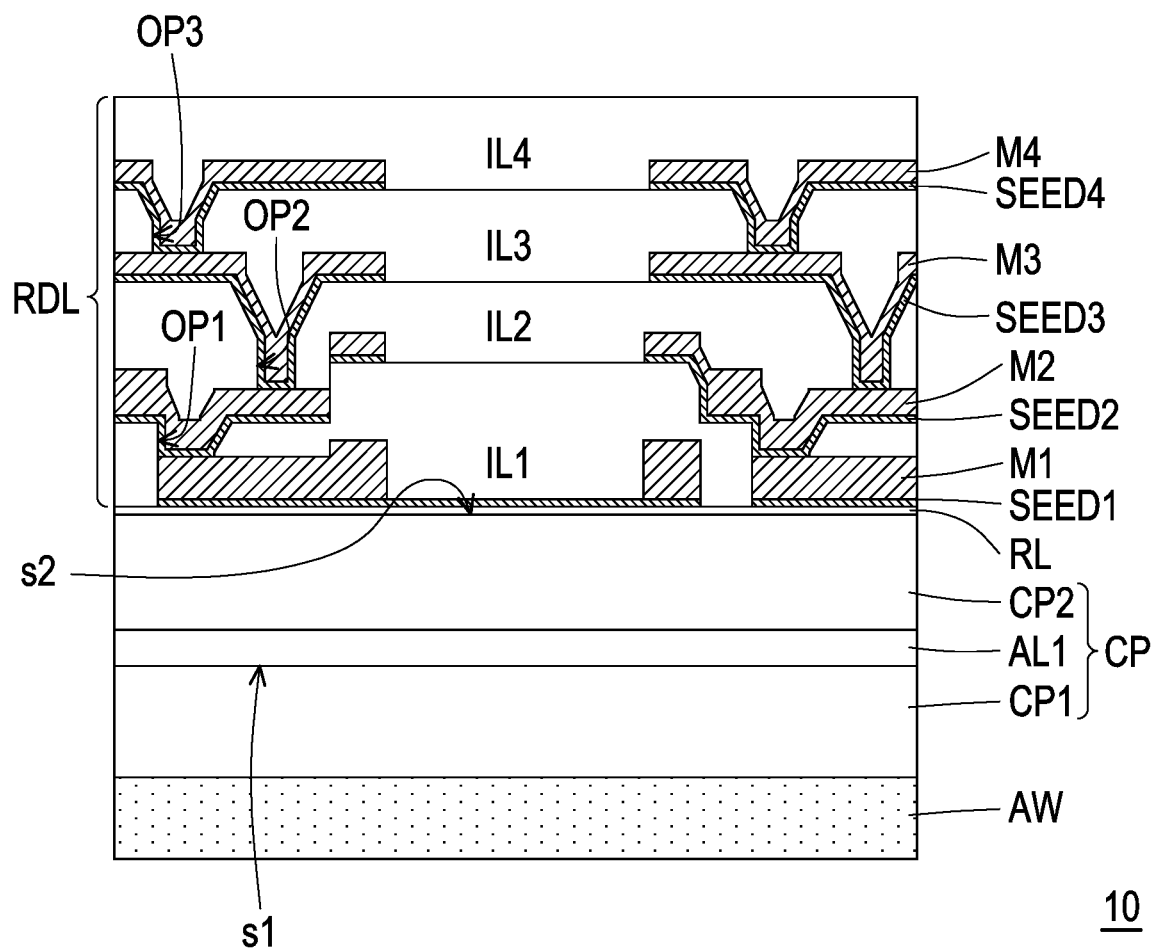

FIG. 1A to FIG. 1C are schematic partial cross-sectional diagrams of a manufacturing method of a package structure of an electronic device according to a first embodiment of the disclosure.

Referring to FIG. 1A, a carrier plate CP is provided. The carrier plate CP includes a composite structure and has a first surface s1 and a second surface s2 opposite to each other. In the embodiment, the carrier plate CP includes a first substrate CP1, a second substrate CP2, and an adhesive layer ALL The first substrate CP1 and the second substrate CP2 are boned to each other through the adhesive layer ALL Specifically, the adhesive layer AL1 is disposed between the first substrate CP1 and the second substrate CP2 so that the first substrate CP1 and the second substrate CP2 are bonded to each other and have sufficient stiffness to endure a further process. The first substrate CP1 and the second substrate CP2 may be, for example, glass substrates, silicon substrates, sapphire substrates, or other suitable substrates. In the embodiment, the first substrate CP1 and the second substrate CP2 are glass substrates. Hence, the first substrate CP1 and the second substrate CP2 form a glass on glass (GOG) structure. In some embodiments, a thickness of the first substrate CP1 and a thickness of the second substrate CP2 may be respectively greater than or equal to 0.5 mm and less than or equal to 1.8 mm (0.5 mm≤Substrate thickness≤1.8 mm); however, the disclosure is not limited thereto. In some embodiments, a coefficient of thermal expansion of the first substrate CP1 and a coefficient of thermal expansion of the second substrate CP2 may be respectively greater than or equal to 3 ppm/K and less than or equal to 12 ppm/K (3 ppm/K≤Substrate coefficient of thermal expansion≤12 ppm/K). The coefficient of thermal expansion of the first substrate CP1 may be substantially the same as the coefficient of thermal expansion of the second substrate CP2. Or the coefficient of thermal expansion of the first substrate CP1 may be greater than the coefficient of thermal expansion of the second substrate CP2. However, the disclosure is not limited thereto. In some embodiments, the carrier plate CP has a panel level size (i.e. an area of the carrier plate CP is greater than or equal to 50 cm×50 cm). Accordingly, the further process of the embodiment may be an application of fan out panel level package (FOPLP). The fan out panel level package includes the above RDL first process or chip first process. In the embodiment, since the fan out panel level package adopts the carrier plate CP having the panel level size, the productivity thereof may be greatly increased compared to the productivity of wafer level package. At the same time, the carrier plate CP having the panel level size has a rectangle outline, compared to wafer level package, the utilization ratio of the carrier plate CP may also be greatly increased. As a result, the package structure of the electronic device manufactured in the embodiment may be configured to realize the requirement of high productivity.

Referring to FIG. 1B, an anti-warpage structure AW is formed on the first surface s1 of the carrier plate CP. In the embodiment, the anti-warpage structure AW may be a single layer structure including an organic material; however, the disclosure is not limited thereto. In some embodiments, a thickness of the anti-warpage structure AW may be greater than or equal to 0.02 mm and less than or equal to 0.2 mm (0.02 mm≤Thickness≤0.2 mm); however, the disclosure is not limited thereto. In some embodiments, the anti-warpage structure AW includes an organic compound having an epoxy-group, and a coefficient of thermal expansion of the anti-warpage structure AW may be greater than the coefficient of thermal expansion of the first substrate CP1. For example, the organic compound having the epoxy-group included in the anti-warpage structure AW may include an aryl group, such as bisphenol A, benzene, biphenyl, naphthalene, and the like. Or the coefficient of thermal expansion of the anti-warpage structure AW may be greater than or equal to 30 ppm/K and less than or equal to 180 ppm/K (30 ppm/K≤Coefficient of thermal expansion≤180 ppm/K); however, the disclosure is not limited thereto. In other embodiments, the coefficient of thermal expansion of the anti-warpage structure AW may be greater than or equal to 30 ppm/K and less than or equal to 60 ppm/K (30 ppm/K≤Coefficient of thermal expansion≤60 ppm/K).

Referring to FIG. 1C, a redistribution structure RDL is formed on the second surface s2 of the carrier plate CP. In some embodiments, before the redistribution structure RDL is formed on the second surface s2 of the carrier plate CP, a release layer RL may be first selectively formed on the second surface s2 of the carrier plate CP. The release layer RL is provided so that a component further disposed on the carrier plate CP may be easily separated from the carrier plate. A material of the release layer RL may be selected as, for example, a suitable organic material; however, the disclosure is not limited thereto. In the embodiment, forming the redistribution structure RDL on the second surface s2 of the carrier plate CP includes the following; however, the disclosure is not limited thereto.

First, a metal layer M1 is formed on the second surface s2 of the carrier plate CP. In some embodiments, before the metal layer M1 is formed, a seed layer SEED1 may be formed first. A method of forming the seed layer SEED1 may be, for example, using a physical vapor deposition process or a chemical vapor deposition process; however, the disclosure is not limited thereto. A material of the seed layer SEED1 may be, for example, metal, and the seed layer SEED1 may have, for example, a single layer structure having one type of metal or a composite structure of multiple sublayers formed with different metal, and the sublayers are stacked with each other. For example, the seed layer SEED1 of the embodiment may include a titanium layer and a copper layer stacked on the titanium layer and have a composite layer structure; however, the disclosure is not limited thereto. In the embodiment, forming the metal layer M1 may include the following. A mask (not shown) is formed on the second surface s2 of the carrier plate CP. The mask includes multiple openings exposing a portion of the seed layer SEED1, and the seed layer SEED1 is grown by, for example, using an electroplating process in the openings to form the metal layer M1. Accordingly, a material of the metal layer M1 may be, for example, the same as the material of the seed layer SEED1; however, the disclosure is not limited thereto. In the embodiment, the material of the metal layer M1 includes copper. In addition, in some embodiments, a thickness of the metal layer M1 may be greater than or equal to 0.002 mm and less than or equal to 0.005 mm (0.002 mm≤Thickness≤0.005 mm); however, the disclosure is not limited thereto. When the metal layer M1 is a copper layer, a coefficient of thermal expansion of the metal layer M1 may be, for example, greater than or equal to 20 ppm/K and less than or equal to 30 ppm/K (20 ppm/K≤Coefficient of thermal expansion≤30 ppm/K).

Next, an insulation layer IL1 is formed on the second surface s2 of the carrier plate CP. The insulation layer IL1 includes an opening OP1 exposing a portion of the metal layer M1. A method of forming the insulation layer IL1 may include the following. First, an insulation material layer (not shown) covering the metal layer M1 is formed on the second surface s2 of the carrier plate CP. The insulation material layer may be formed, for example, by using a chemical vapor deposition process or other suitable processes, and the disclosure is not limited thereto. Next, a patterning process is performed on the insulation material layer to form the insulation layer IL1 having multiple openings OP1. The openings OP1 expose a portion of the metal layer M1. A material of the insulation layer IL1 may be, for example, an organic material, oxide, nitride, phosphosilicate glass, borophosphosilicate glass, or a combination thereof, and the disclosure is not limited thereto. In the embodiment, the material of the insulation layer IL1 is polyimide or epoxy. In addition, in some embodiments, a thickness of the insulation layer IL1 may be greater than or equal to 0.01 mm and less than or equal to 0.1 mm (0.01 mm≤Thickness≤0.1 mm); however, the disclosure is not limited thereto. In a case where the material of the insulation layer IL1 is polyimide, a coefficient of thermal expansion of the insulation layer IL1 may be, for example, greater than or equal to 30 ppm/K and less than or equal to 60 ppm/K (30 ppm/K≤Coefficient of thermal expansion≤60 ppm/K). Or the coefficient of thermal expansion of the insulation layer IL1 may also be, for example, greater than or equal to 30 ppm/K and less than or equal to 35 ppm/K (30 ppm/K≤Coefficient of thermal expansion≤35 ppm/K). In a case where the material of the insulation layer IL1 is epoxy, the coefficient of thermal expansion of the insulation layer IL1 may be, for example, greater than or equal to 10 ppm/K and less than or equal to 40 ppm/K (10 ppm/K≤Coefficient of thermal expansion≤40 ppm/K). Or the coefficient of thermal expansion of the insulation layer IL1 may also be, for example, greater than or equal to 15 ppm/K and less than or equal to 20 ppm/K (15 ppm/K≤Coefficient of thermal expansion≤20 ppm/K).

In the embodiment, a cycle of the processes of forming the metal layer and the insulation layer may be repeated to form the redistribution structure RDL as shown in FIG. 1C. The redistribution structure RDL may serve as a redistribution layer of an electronic device to provide a required conductive transmission path. For example, as shown in FIG. 1C, the redistribution structure RDL may include the seed layer SEED1, the metal layer M1, the insulation layer IL1 having the multiple openings OP1, a seed layer SEED2, a metal layer M2, an insulation layer IL2 having multiple openings OP2, a seed layer SEED3, a metal layer M3, an insulation layer IL3 having multiple openings OP3, a seed layer SEED4, a metal layer M4, and an insulation layer IL4; however, the disclosure is not limited thereto. It is worth noting that although the manufacturing method of a package structure 10 of the embodiment is described with the method above as an example, the method of forming the package structure of the disclosure is not limited thereto. For example, after the redistribution structure RDL is formed, a process of forming a semiconductor chip may continue being performed. That is, the manufacturing method of the package structure 10 of the embodiment is the RDL first process. In addition, the package structure 10 of the embodiment of the disclosure is, for example, applied to panel level package; however, the disclosure is not limited thereto. The package structure of the disclosure may be also applied to various semiconductor devices and/or semiconductor manufacturing processes.

A heating process may be performed while forming the redistribution structure RDL, and the metal layers (e.g. the metal layer M1, the metal layer M2, the metal layer M3, the metal layer M4) and the insulation layers (e.g. the insulation layer IL1, the insulation layer IL2, the insulation layer IL3, the insulation layer IL4) included in the redistribution structure RDL have the coefficients of thermal expansion that are greater than the coefficient of thermal expansion of the first substrate CP1 and/or the coefficient of thermal expansion of the second substrate CP2. Hence, after the redistribution structure RDL is disposed on the second surface s2 of the carrier plate CP, an edge of the carrier plate CP may be warped in a direction of facing the redistribution structure RDL. To address this technical issue, in the embodiment, the anti-warpage structure AW is first disposed on the first surface s1 of the carrier plate CP opposite to the surface s2, and the coefficient of thermal expansion of the anti-warpage structure AW is also greater than the coefficient of thermal expansion of the carrier plate CP. Hence, after the anti-warpage structure AW is disposed on the first surface s1 of the carrier plate CP, the edge of the carrier plate CP may be warped in a direction of facing the anti-warpage structure AW. Accordingly, in the embodiment, with the anti-warpage structure AW, warpage of the package structure 10 generated at the time when temperature changes due to the different coefficients of thermal expansion of the redistribution structure RDL and the carrier plate CP may be reduced. Hence, reliability and/or electrical properties of the electronic device including the package structure 10 may be enhanced. For example, if the coefficient of thermal expansion of the anti-warpage structure AW is substantially the same as the coefficient of thermal expansion of the redistribution structure RDL (e.g. the same as an average of the coefficients of thermal expansion of the metal layers and the insulation layers), warpage of the package structure 10 may not occur.

FIG. 2A to FIG. 2D are schematic partial cross-sectional diagrams of a manufacturing method of a package structure of an electronic device according to a second embodiment of the disclosure. Note that the structural reference numerals and some description of the embodiments of FIG. 1A to FIG. 1C may be adopted in some embodiments of FIG. 2A to FIG. 2D. The same or similar reference numerals are adopted to refer to the same or like parts, and description of the same technical content is omitted.

Figure 2A:
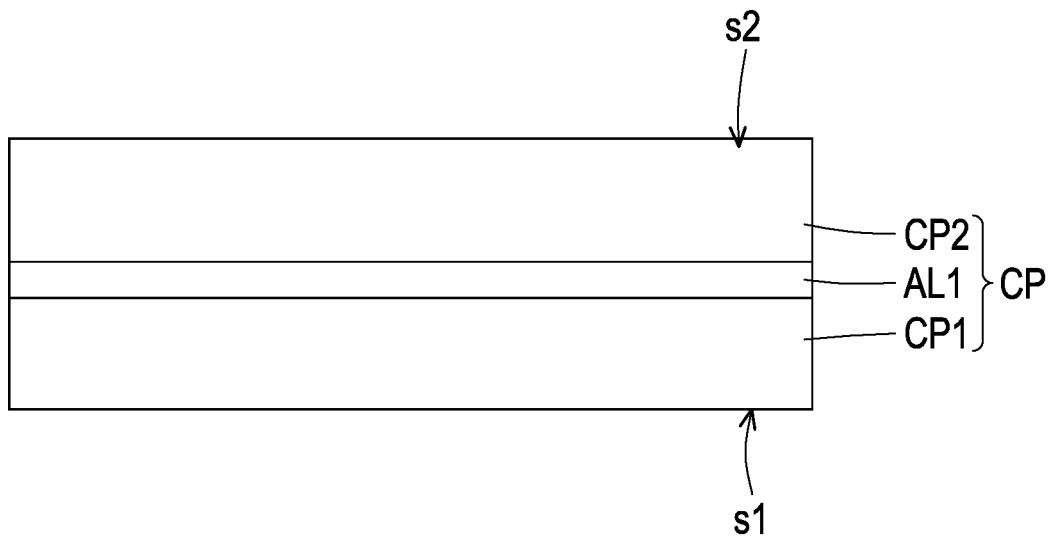
FIG. 2A to FIG. 2D are schematic partial cross-sectional diagrams of a manufacturing method of a package structure of an electronic device according to a second embodiment of the disclosure.

Referring to FIG. 2A, the carrier plate CP is provided. The carrier plate CP includes the composite structure and has the first surface s1 and the second surface s2 opposite to each other. Here, a process of providing the carrier plate CP is similar to the process shown in FIG. 1A, and relevant details are not repeated.

Figure 2B:
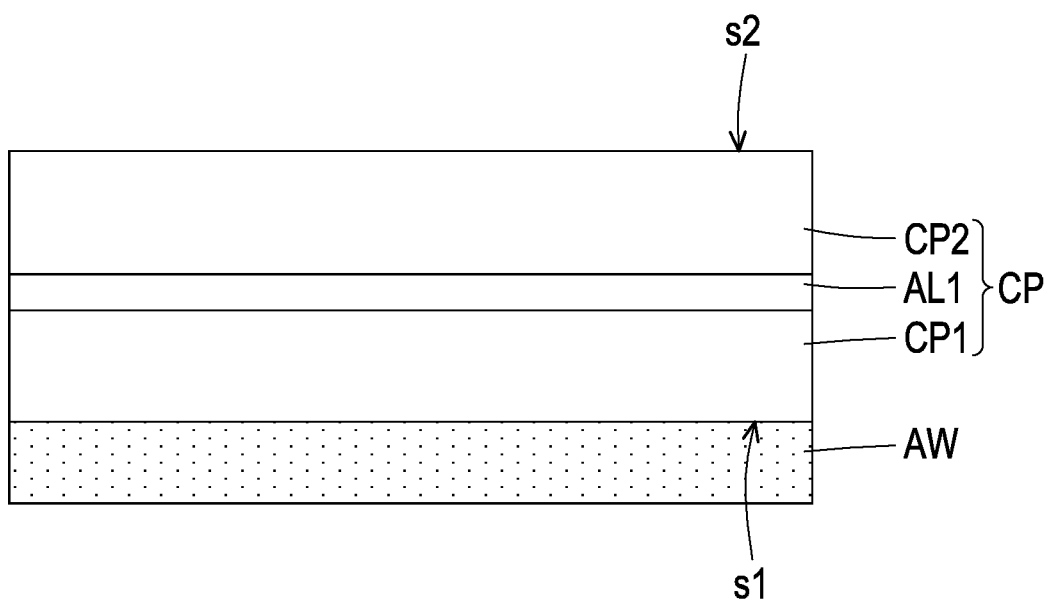

Referring to FIG. 2B, the anti-warpage structure AW is formed on the first surface s1 of the carrier plate CP. Here, a process of forming the anti-warpage structure AW on the first surface s1 of the carrier plate CP is similar to the process shown in FIG. 1B, and relevant details are not repeated.

Figure 2C:
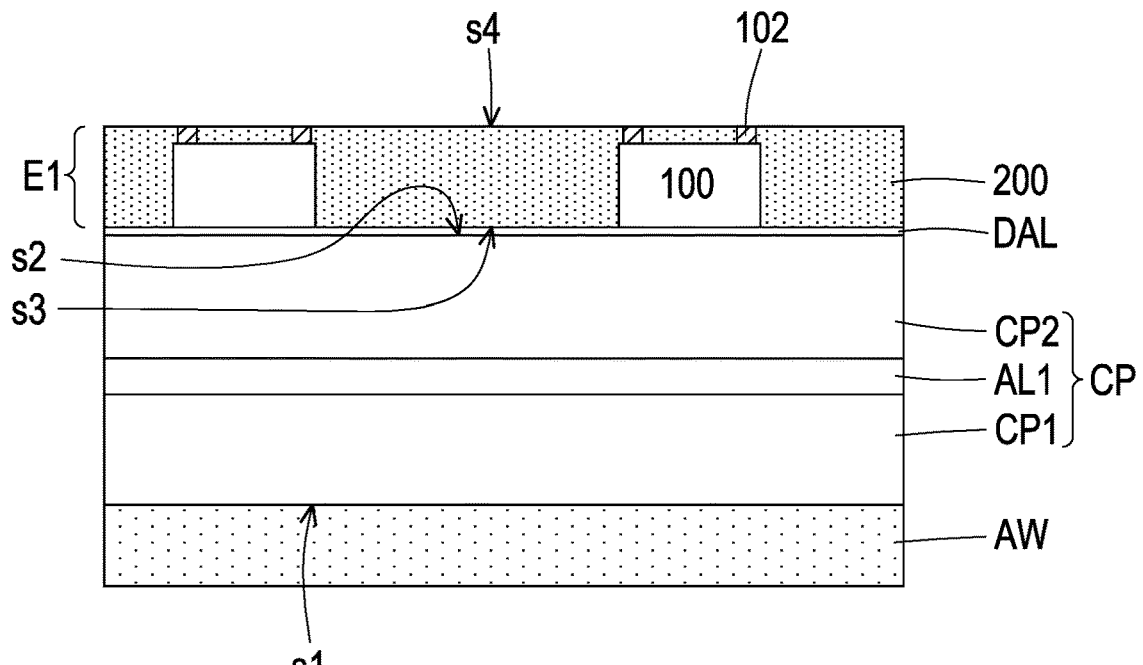

Referring to FIG. 2C, an encapsulation structure E1 is formed on the second surface s2 of the carrier plate CP. Accordingly, the difference between a manufacturing method of a package structure of the embodiment and the manufacturing method of the package structure 10 mainly lies in the following. Before the redistribution structure RDL is formed on the second surface s2 of the carrier plate CP, the method further includes a process of forming the encapsulation structure E1. In some embodiments, the encapsulation structure E1 has a third surface s3 facing the second surface s2 of the carrier plate CP, and the encapsulation structure E1 has a fourth surface s4 away from the second surface s2 of the carrier plate CP. In the embodiment, forming the encapsulation structure E1 on the second surface s2 of the carrier plate CP includes the following; however, the disclosure is not limited thereto.

First, a semiconductor chip 100 is disposed on the second surface s2 of the carrier plate CP. The semiconductor chip 100 may include, for example, a packaged semiconductor die, and the disclosure is not limited thereto. For example, the semiconductor chip 100 may include a semiconductor chip, such as an application-specific integrated circuit chip, an analog chip, a digital chip, a voltage regulator chip, a sensor chip, or a memory chip. In some embodiments, a die attached film DAL may be formed between the semiconductor chip 100 and the second surface s2 of the carrier plate CP so that the semiconductor chip 100 may be attached to the second surface s2 of the carrier plate CP. A material of the die attached film DAL may include, for example, an organic material, an inorganic material, or other suitable attaching materials; however, the disclosure is not limited thereto. In the embodiment, the semiconductor chip 100 is disposed facing up. That is, in some embodiments, a pad 102 is disposed on a surface of the semiconductor chip 100 away from the carrier plate CP to be further electrically connected to the redistribution structure RDL that a user desires to dispose.

Next, an encapsulation layer 200 is formed on the second surface s2 of the carrier plate CP. The encapsulation layer 200 exposes a portion of the pad 102. A method of forming the encapsulation layer 200 may include, for example, the following. First, an encapsulation material layer (not shown) surrounding and covering the semiconductor chip 100 is formed on the second surface s2 of the carrier plate CP. The encapsulation material layer may be formed, for example, by using a press molding process or other suitable processes, and the disclosure is not limited thereto. Next, a planarization process (e.g. through polishing) is performed on the encapsulation material layer until the pad 102 is exposed to form the encapsulation layer 200. A material of the encapsulation layer 200 may be, for example, an organic material or other suitable materials; however, the disclosure is not limited thereto. In the embodiment, the material of the encapsulation layer 200 may be epoxy, but the disclosure is not limited thereto. In addition, in some embodiments, a thickness of the encapsulation layer 200 may be greater than or equal to 0.1 mm and less than or equal to 0.2 mm (0.1 mm≤Thickness≤0.2 mm); however, the disclosure is not limited thereto. Accordingly, a coefficient of thermal expansion of the encapsulation layer 200 may be, for example, greater than or equal to 40 ppm/K and less than or equal to 60 ppm/K (40 ppm/K≤Coefficient of thermal expansion≤60 ppm/K). Or the coefficient of thermal expansion of the encapsulation layer 200 may also be, for example, greater than or equal to 40 ppm/K and less than or equal to 45 ppm/K (40 ppm/K≤Coefficient of thermal expansion≤45 ppm/K).

Figure 2D:
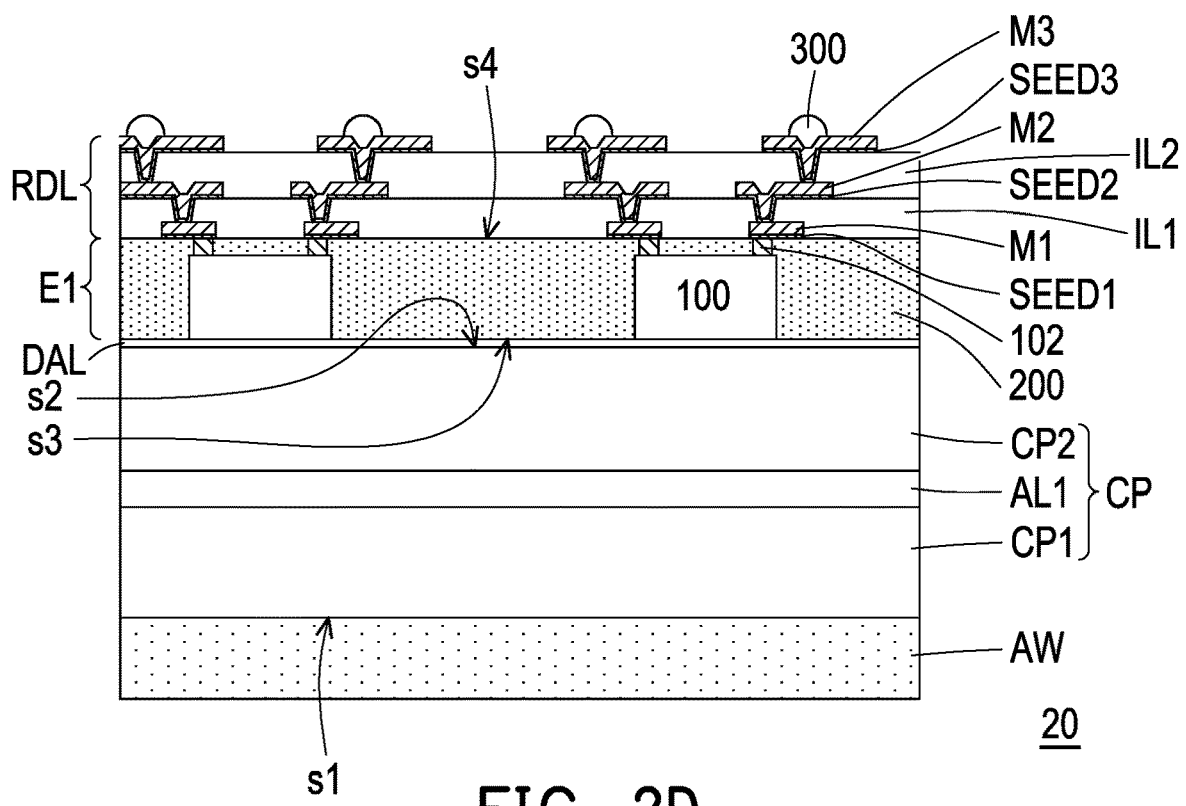

Referring to FIG. 2D, the redistribution structure RDL is formed on the second surface s2 of the carrier plate CP (more specifically, the fourth surface s4 of the encapsulation structure E1). Here, a process of forming the redistribution structure RDL is similar to the process shown in FIG. 1C, and relevant details are not repeated. Here, it is worth noting that the manufacturing method of a package structure 20 of the embodiment is a chip first process. In some embodiments, multiple conductive terminals 300 may be formed on the redistribution structure RDL. The conductive terminals 300 may be, for example, disposed on and electrically connected to the metal layer M3 of the redistribution structure RDL. Hence, the conductive terminals 300 may be electrically connected to the semiconductor chip 100 through the redistribution structure RDL. The conductive terminals 300 may be formed, for example, through a ball placement process or a reflow process; however, the disclosure is not limited thereto. In some embodiments, the conductive terminals 300 may be solder balls shown in FIG. 2D or disposed as conductive pillars or conductive posts, and the disclosure is not limited thereto.

Similarly, in the embodiment, with the anti-warpage structure AW, warpage of the package structure 20 generated at the time when temperature changes due to the different coefficients of thermal expansion of the redistribution structure RDL and/or the encapsulation structure E1 and the carrier plate CP may be reduced. Hence, reliability and/or electrical properties of the electronic device including the package structure 20 may be enhanced.

FIG. 3A to FIG. 3E are schematic partial cross-sectional diagrams of a manufacturing method of a package structure of an electronic device according to a third embodiment of the disclosure. Note that the structural reference numerals and some description of the embodiments of FIG. 1A to FIG. 1C may be adopted in some embodiments of FIG. 3A to FIG. 3E. The same or similar reference numerals are adopted to refer to the same or like parts, and description of the same technical content is omitted.

Figure 3A:
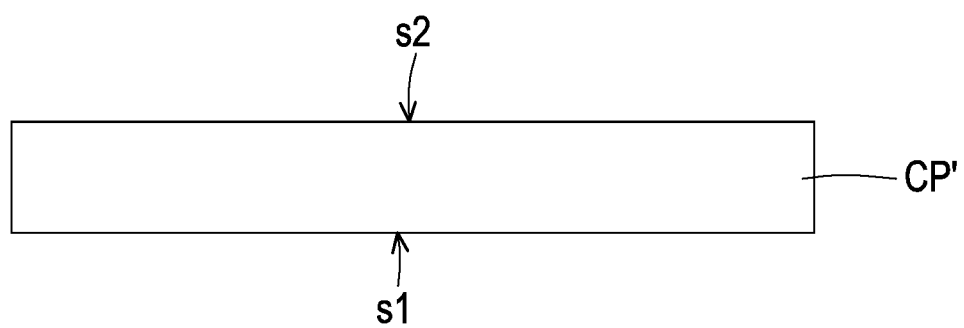
FIG. 3A to FIG. 3E are schematic partial cross-sectional diagrams of a manufacturing method of a package structure of an electronic device according to a third embodiment of the disclosure.

Referring to FIG. 3A, a carrier plate CP' is provided. The carrier plate CP' includes a single layer structure and has the first surface s1 and the second surface s2 opposite to each other. In the embodiment, the carrier plate CP' is removed in a further process. Hence, the carrier plate CP' may not include a composite structure and have sufficient stiffness; however, the disclosure is not limited thereto. The carrier plate CP' may be, for example, a glass carrier plate, a silicon carrier plate, a sapphire carrier plate, or other suitable carrier plates. In the embodiment, the carrier plate CP' is the glass carrier plate. In some embodiments, a thickness of the carrier plate CP' may be greater than or equal to 0.5 mm and less than or equal to 1.8 mm (0.5 mm≤Carrier plate thickness≤1.8 mm); however, the disclosure is not limited thereto. In some embodiments, a coefficient of thermal expansion of the carrier plate CP' may be greater than or equal to 3 ppm/K and less than or equal to 12 ppm/K (3 ppm/K≤Coefficient of thermal expansion≤12 ppm/K). In some embodiments, the carrier plate CP' has a panel level size. Accordingly, in a further process in the embodiment, for example, a chip may be disposed on the carrier plate CP' having the panel level size. That is, the manufacturing method of a package structure shown in the embodiment may be, for example, applied to a chip first process. In the embodiment, the fan out panel level package adopts the carrier plate CP' having the panel level size. As a result, the package structure of the electronic device manufactured in the embodiment may be configured to realize the requirement of high productivity.

Figure 3B:
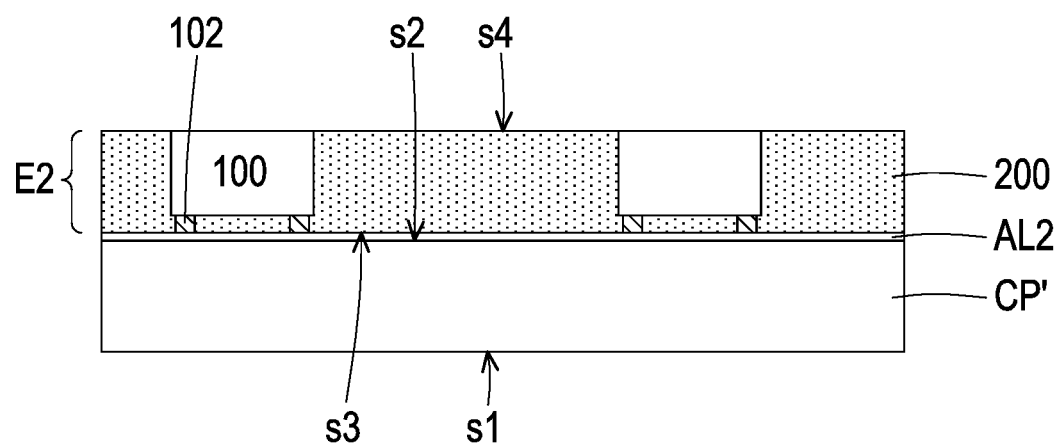

Referring to FIG. 3B, an encapsulation structure E2 is formed on the carrier plate CP'. In some embodiments, the encapsulation structure E2 includes the semiconductor chip 100 and the encapsulation layer 200 and has the third surface s3 and the fourth surface s4 opposite to each other. For example, the encapsulation structure E2 has the third surface s3 facing the second surface s2 of the carrier plate CP', and the encapsulation structure E2 has the fourth surface s4 away from the second surface s2 of the carrier plate CP'. In the embodiment, forming the encapsulation structure E2 on the second surface s2 of the carrier plate CP' includes the following; however, the disclosure is not limited thereto.

First, the semiconductor chip 100 is disposed on the second surface s2 of the carrier plate CP'. The semiconductor chip 100 may include, for example, a packaged semiconductor die, and the disclosure is not limited thereto. For example, the semiconductor chip 100 may include a semiconductor chip, such as an application-specific integrated circuit chip, an analog chip, a digital chip, a voltage regulator chip, a sensor chip, or a memory chip. In addition, in some embodiments, the pad 102 is disposed on the semiconductor chip 100 close to the second surface s2 of the carrier plate CP' to be further electrically connected to the redistribution structure RDL that the user desires to dispose. In some embodiments, an adhesive layer AL2 may be formed between the semiconductor chip 100 and the second surface s2 of the carrier plate CP' so that the semiconductor chip 100 may be attached to the second surface s2 of the carrier plate CP'; however, the disclosure is not limited thereto. That is, in the embodiment, the semiconductor chip 100 is disposed facing down; however, the disclosure is not limited thereto. A material of the adhesive layer AL2 may include, for example, a thermal release material, an organic material, an inorganic material, or other suitable adhesive materials; however, the disclosure is not limited thereto.

Next, the encapsulation layer 200 is formed on the second surface s2 of the carrier plate CP'. The encapsulation layer 200 exposes a portion of the semiconductor chip 100. A method of forming the encapsulation layer 200 may include, for example, the following. First, an encapsulation material layer covering and surrounding the semiconductor chip 100 is formed on the second surface s2 of the carrier plate CP'. The encapsulation material layer may be formed, for example, by using a press molding process or other suitable processes, and the disclosure is not limited thereto. Next, a planarization process is performed on the encapsulation material layer until the semiconductor chip 100 is exposed to form the encapsulation layer 200. A material of the encapsulation layer 200 may be, for example, an organic material or other suitable materials; however, the disclosure is not limited thereto. In the embodiment, the material of the encapsulation layer 200 may be epoxy. In addition, in some embodiments, the thickness of the encapsulation layer 200 may be greater than or equal to 0.1 mm and less than or equal to 0.2 mm (0.1 mm≤Thickness≤0.2 mm); however, the disclosure is not limited thereto. Accordingly, the coefficient of thermal expansion of the encapsulation layer 200 may be, for example, greater than or equal to 40 ppm/K and less than or equal to 60 ppm/K (40 ppm/K≤Coefficient of thermal expansion≤60 ppm/K). Or the coefficient of thermal expansion of the encapsulation layer 200 may also be, for example, greater than or equal to 40 ppm/K and less than or equal to 45 ppm/K (40 ppm/K≤Coefficient of thermal expansion≤45 ppm/K).

Figure 3C:
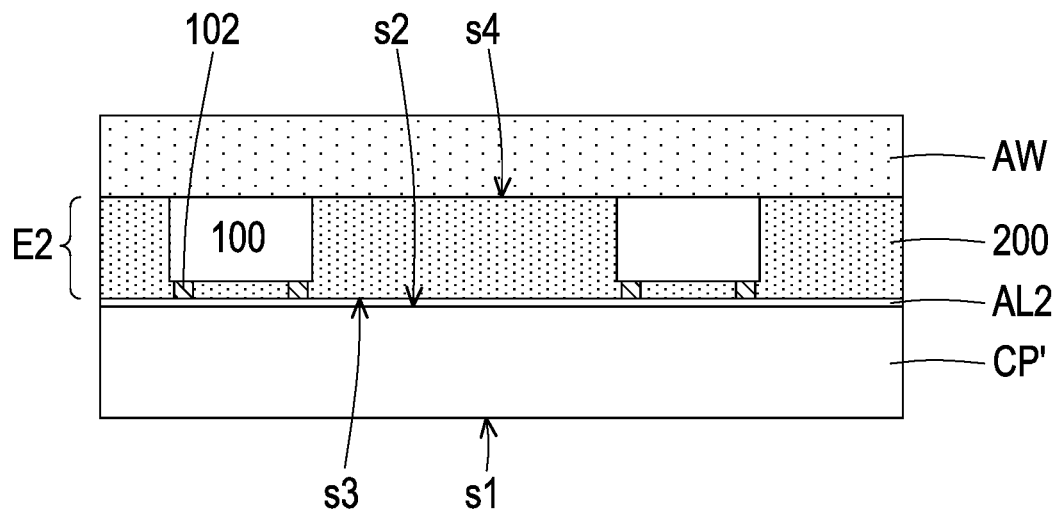

Referring to FIG. 3C, the anti-warpage structure AW is formed on the fourth surface s4 of the encapsulation structure E2. Here, a process of forming the anti-warpage structure AW on the fourth surface s4 of the encapsulation structure E2 is similar to the process shown in FIG. 1B, and relevant details are not repeated.

Figure 3D:
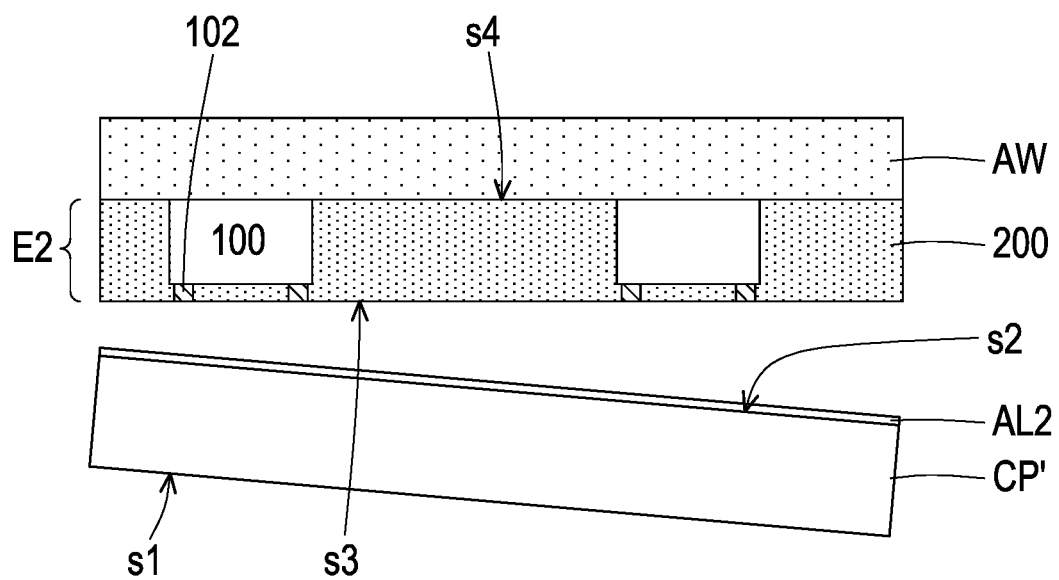

Referring to FIG. 3D, the carrier plate CP' is removed. In the embodiment, at the same time when the carrier plate CP' is removed, the adhesive layer AL2 is also removed. The carrier plate CP' is removed by, for example, performing a suitable stripping process, and the disclosure is not limited thereto. In the embodiment, after the carrier plate CP' is removed, the pad 102 is exposed by the third surface s3 of the encapsulation layer 200.

Figure 3E:
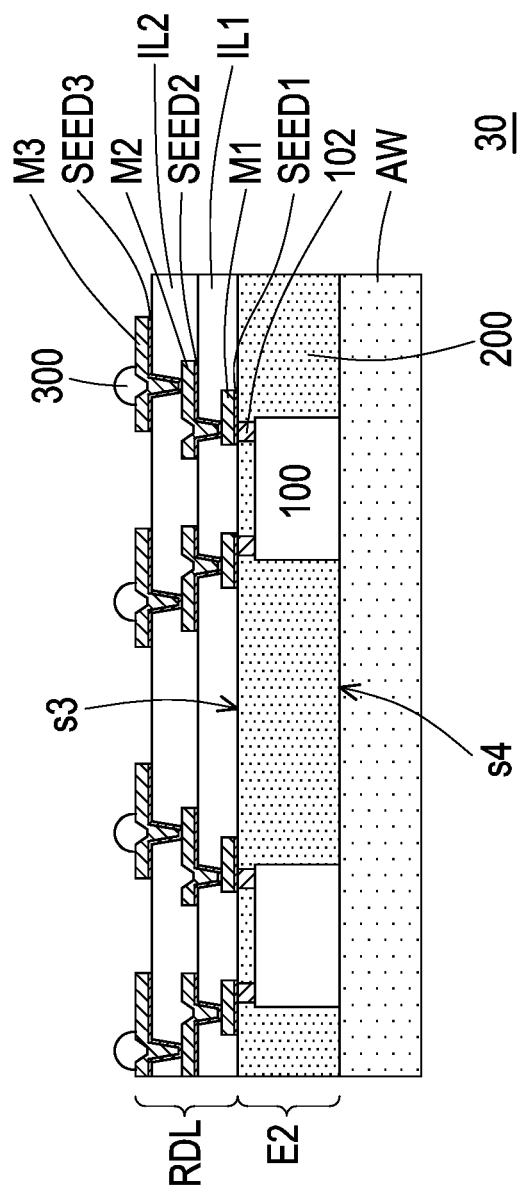

Referring to FIG. 3E, the redistribution structure RDL is formed on the third surface s3 of the encapsulation structure E2. Here, a process of forming the redistribution structure RDL on the third surface s3 of the encapsulation structure E2 is similar to the process shown in FIG. 1C, and relevant details are not repeated. Here, it is worth noting that the manufacturing method of a package structure 30 of the embodiment is a chip first process.

In addition, the package structure 10, the package structure 20, and the package structure 30 above may be bonded to, for example, an electronic device, such as an integrated circuit chip and/or a printed circuit board, in a further process; however, the disclosure is not limited thereto. A bonding method may be, for example, providing a pad between the redistribution structure RDL and the electronic device; however, the disclosure is not limited thereto.

In summary of the above, in the manufacturing method of the package structure provided in the embodiments of the disclosure, the anti-warpage structure AW is disposed on the surface of the carrier plate that is opposite to the surface provided with the redistribution structure and/or the encapsulation structure. Hence, the warpage of the package structure generated at the time when temperature changes due to the different coefficients of thermal expansion of the redistribution structure and/or the encapsulation structure and the carrier plate may be reduced, and the reliability and/or the electrical properties of the electronic device including the package structure are thus enhanced.

Lastly, it is to be noted that: the embodiments described above are only used to illustrate the technical solutions of the disclosure, and not to limit the disclosure; although the disclosure is described in detail with reference to the embodiments, those skilled in the art should understand: it is still possible to modify the technical solutions recorded in the embodiments, or to equivalently replace some or all of the technical features; the modifications or replacements do not cause the essence of the corresponding technical solutions to deviate from the scope of the technical solutions of the embodiments. The features of the embodiments may be arbitrarily mixed and combined as long as they do not depart from or conflict with the spirit of the disclosure.

What is claimed is:

1. A manufacturing method of a package structure of an electronic device, comprising:
    providing a carrier plate, wherein the carrier plate comprises a composite structure and has a first surface and a second surface opposite to each other;
    forming an anti-warpage structure on the first surface of the carrier plate to make the carrier plate have a first warpage direction; and
    forming a redistribution structure on the second surface of the carrier plate to make the carrier plate has a second warpage direction opposite to the first warpage direction,
    wherein the carrier plate comprises a first substrate, a second substrate, and an adhesive layer, wherein the first substrate and the second substrate are bonded to each other through the adhesive layer,
    wherein a coefficient of thermal expansion of the anti-warpage structure is greater than or equal to 30 ppm/K and less than or equal to 180 ppm/K, and a coefficient of thermal expansion of the first substrate and a coefficient of thermal expansion of the second substrate are greater than or equal to 3 ppm/K and less than or equal to 12 ppm/K.

2. The manufacturing method of the package structure of the electronic device according to claim 1, wherein the anti-warpage structure comprises an organic compound having an epoxy-group.

3. The manufacturing method of the package structure of the electronic device according to claim 2, wherein the anti-warpage structure comprises bisphenol A, benzene, biphenyl, naphthalene, or a combination thereof.

4. The manufacturing method of the package structure of the electronic device according to claim 1, wherein forming the redistribution structure on the second surface of the carrier plate comprises:
    forming a metal layer on the second surface of the carrier plate; and
    forming an insulation layer on the second surface of the carrier plate, wherein the insulation layer comprises an opening exposing a portion of the metal layer.

5. The manufacturing method of the package structure of the electronic device according to claim 4, wherein a coefficient of thermal expansion of the insulation layer is greater than or equal to 30 ppm/K and less than or equal to 60 ppm/K.

6. The manufacturing method of the package structure of the electronic device according to claim 1, wherein before forming the redistribution structure on the second surface of the carrier plate, further comprising:
    forming a semiconductor chip on the second surface of the carrier plate, wherein a pad is disposed on a surface of the semiconductor chip away from the carrier plate; and
    forming an encapsulation layer on the second surface of the carrier plate, wherein the encapsulation layer exposes the pad, and the semiconductor chip is electrically connected to the redistribution structure through the pad.

7. The manufacturing method of the package structure of the electronic device according to claim 1, wherein a thickness of the anti-warpage structure is greater than or equal to 0.02 mm and less than or equal to 0.2 mm.

8. The manufacturing method of the package structure of the electronic device according to claim 1, wherein the first substrate and the second substrate are glass substrates.

9. The manufacturing method of the package structure of the electronic device according to claim 1, wherein a thickness of the first substrate and a thickness of the second substrate are respectively greater than or equal to 0.5 mm and less than or equal to 1.8 mm.

10. The manufacturing method of the package structure of the electronic device according to claim 1, wherein before forming the redistribution structure on the second surface of the carrier plate, a release layer is formed on the second surface of the carrier plate.

* * * * *